United States Patent
Nyström

(10) Patent No.: US 12,055,594 B2
(45) Date of Patent: Aug. 6, 2024

(54) MEASUREMENT SYSTEM AND METHOD FOR DETERMINING A STATUS OF A POWER SYSTEM IN A VEHICLE USING THE MEASUREMENT SYSTEM

(71) Applicant: VOLVO TRUCK CORPORATION, Gothenburg (SE)

(72) Inventor: Mats Nyström, Torslanda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 0 days.

(21) Appl. No.: 17/451,240

(22) Filed: Oct. 18, 2021

(65) Prior Publication Data

US 2022/0128630 A1 Apr. 28, 2022

(30) Foreign Application Priority Data

Oct. 22, 2020 (EP) .................................. 20203411

(51) Int. Cl.
*G01R 31/392* (2019.01)
*B60L 58/16* (2019.01)
(Continued)

(52) U.S. Cl.
CPC ............ *G01R 31/392* (2019.01); *B60L 58/16* (2019.02); *G01R 31/367* (2019.01); *H01M 10/48* (2013.01)

(58) Field of Classification Search
CPC .... G01R 31/392; G01R 31/367; G01R 31/00; G01R 35/00; G01R 19/0038;
(Continued)

(56) References Cited

U.S. PATENT DOCUMENTS

2013/0293237 A1* 11/2013 Thommes ............ G01R 31/006
324/503
2015/0210165 A1 7/2015 Lachmund et al.
(Continued)

FOREIGN PATENT DOCUMENTS

CN 104507756 A * 4/2015 ........... B60R 16/033
DE 102008006223 A1 8/2009
(Continued)

OTHER PUBLICATIONS

European Search Report dated Mar. 31, 2021 in corresponding European Patent Application No. 20203411.2, 32 pages.

*Primary Examiner* — Catherine T. Rastovski
*Assistant Examiner* — Lal C Mang
(74) *Attorney, Agent, or Firm* — Venable LLP; Jeffri A. Kaminski

(57) ABSTRACT

A measurement system for determining a status of a high-voltage power system in a vehicle, the measurement system comprising: a first voltage measurement unit and a second voltage measurement unit, each of the first and second voltage measurement units being connected between a positive pole and a negative pole of the power system; a measurement system control unit connected to the first and second voltage measurement unit and configured to: control the first and second voltage measurement unit to simultaneously measure a voltage to determine a respective first and second pole-to-pole voltage; compare the first pole-to-pole voltage with the second pole-to-pole voltage, and if a voltage difference is higher than a voltage threshold value, provide an indication that the voltage measurement is not reliable.

12 Claims, 3 Drawing Sheets

(51) Int. Cl.
*G01R 31/367* (2019.01)
*H01M 10/48* (2006.01)

(58) Field of Classification Search
CPC .......... G01R 19/16576; G01R 19/2513; B60L 58/16; H01M 10/48; Y02E 60/10; Y02T 10/70
See application file for complete search history.

(56) References Cited

U.S. PATENT DOCUMENTS

| | | | |
|---|---|---|---|
| 2016/0193926 A1* | 7/2016 | Abraham | B60L 3/0069 |
| 2018/0024198 A1 | 1/2018 | Izawa | |
| 2018/0024201 A1* | 1/2018 | Izawa | B60L 3/12 |
| | | | 324/434 |
| 2018/0026456 A1* | 1/2018 | Kang | H01M 10/441 |
| | | | 320/134 |
| 2020/0106082 A1* | 4/2020 | Fukushima | B60L 50/60 |

FOREIGN PATENT DOCUMENTS

| | | | | |
|---|---|---|---|---|
| JP | 2013024800 A | * | 2/2013 | ............. G01R 19/00 |
| JP | 2013024800 A | | 2/2013 | |

* cited by examiner

MEASUREMENT SYSTEM AND METHOD FOR DETERMINING A STATUS OF A POWER SYSTEM IN A VEHICLE USING THE MEASUREMENT SYSTEM

TECHNICAL FIELD

The invention relates to a measurement system and method for determining a status of a power system in an electrical or hybrid vehicle. In particular, the invention relates to a system and method for ensuring the absence of hazardous voltages in a high-voltage system of an electrical vehicle.

The invention is applicable in electrical and hybrid vehicles within the fields of trucks, buses, industrial construction machines and the like. Although the invention will be described with reference to a truck, the invention is not restricted to this particular vehicle, but may also be used in other electric vehicles.

BACKGROUND

In vehicles comprising electrical or hybrid drive systems, it is important to be able to safely disconnect the high-voltage energy source from the other high-voltage vehicle systems, for example for allowing the vehicle to be serviced and repaired in a secure manner. There are typically ways of manually shutting down or otherwise disconnecting the high-voltage system. However, due to the potentially great hazards of working with a high-voltage system that has not been properly shut down, back-up systems for ensuring that no high-voltage components are accessible to a user are desirable.

Moreover, according to safety standards such as CENELEC—EN 50110, it is required that a secure measurement is performed to confirm the absence of hazardous voltages in the system. Such a secure measurement is often performed by connecting an external device to the vehicle power system and measuring the voltage at a selected location.

However, when connecting an external device there is always a risk of a faulty connection or that the external device may malfunction and/or show a faulty result. Accordingly, it is desirable to further improve the safety of a high-power vehicle system.

SUMMARY

An object of the invention is to provide a measurement system for determining a status of a power system in a vehicle to improve the safety in a high-voltage power system by ensuring that there are no hazardous voltages in the system.

According to a first aspect of the invention, there is provided a measurement system for determining a status of a power system in a vehicle. The system measurement comprising: a first voltage measurement unit and a second voltage measurement unit, each of the first and second voltage measurement units being connected between a positive pole and a negative pole of the power system; a measurement system control unit connected to the first and second voltage measurement unit and configured to: control the first and second voltage measurement unit to simultaneously measure a voltage to determine a respective first and second pole-to-pole voltage; compare the first pole-to-pole voltage with the second pole-to-pole voltage to determine a voltage difference, and if the voltage difference is higher than a voltage threshold value, provide an indication that the voltage measurement is not reliable.

The power system herein refers to a system for providing electrical power to electrical components of a vehicle. The energy source may be a battery arranged to provide power to an electrical motor for vehicle propulsion, or in the case of a working machine, to an implement of the working machine. The high-voltage system typically operates at voltages over 200V, and often the in the range of 400V to 1000V in order to provide propulsive power for heavy vehicles such as trucks and buses.

The present invention is based on the realization that improved safety in a high-voltage power system for a vehicle can be achieved by independently measuring the pole-to-pole voltage at two separate locations in the system, thereby increasing the reliability and eliminating a number of possible hazards compared to prior art solutions where an external device is connected to the power system.

Since both voltage measurement units are arranged to simultaneously measure a respective pole-to-pole voltage, the measurement results should be the same, at least within the tolerances of the measurement unit, for each measurement. Moreover, the first and second voltage measurement units may be connected at different locations in the power system where the same pole-to-pole voltages are expected. By comparing the two measured voltages, it can be detected both if an absolute value of a measured voltage exceeds safety limits but also if the two voltages differ, which may be caused by a malfunctioning voltage measurement unit or by an electrical fault in the high-voltage system.

A further advantage of the claimed measurement system is that the two measurements are entirely independent of each other and where the evaluation system is the only shared feature. This means that the overall system reliability can be determined as a multiplication of the two failure probabilities of the respective voltage measurement units, which in turn means that the total failure probability is very low.

Moreover, by providing a notification to a user that the voltage measurement is not reliable, the user can be alerted that there may be a hazardous voltage in the vehicle and appropriate precautions can be taken.

According to one embodiment of the invention, the control unit is further configured to control the first and second voltage measurement units to repeatedly measure the respective first and second voltage. The measurements may for example be performed repeatedly as long as work is being performed, thereby ensuring that a mechanic is safe when working with the vehicle. The voltage measurement units may for example be configured to repeatedly measure the first and second voltage with a fixed interval, wherein the fixed interval is in the range of 10 ms to 500 ms.

According to one embodiment of the invention, the control unit is further configured to provide an indication that the voltage measurement is unreliable only if a predetermined number of consecutive voltage differences between the first and second pole-to-pole voltages are above the voltage threshold value. This has the advantage that an alarm or the like is not triggered based on transients or other brief spurious events. The number of consecutive measurements that are required can be determined based on operational parameters of the system, and also based on the thresholds used. For example, for a lower voltage threshold value the required number of consecutive measurements can be set higher compared to if a higher voltage threshold value is used.

According to one embodiment of the invention, the control unit is further configured to detect a change between an active status and a passive status of the power system, and to suppress providing an indication if the voltage difference exceeds the threshold during the change between active status and passive status. When the system is changed between an active status and a passive status, i.e. when the system is started or shut down, there may be voltage transients and/or other voltage swings which are not indicative of a fault in the system. Accordingly, it may be desirable to not provide an indication that the voltage measurement is unreliable during such a change-period, even if the difference in voltage exceeds a previously set threshold value.

According to one embodiment of the invention the control unit may be further configured to use a first voltage threshold value if the power system is in a stable state and a second voltage threshold value if the system is in a transitional state, wherein the second voltage threshold value is higher than the first voltage threshold value. Thereby, the comparison of the two voltage measurements is performed also during a transition period between active and passive status, but with a different threshold value taking the possible voltage variations during start-up and shut down into account.

According to one embodiment of the invention, the system may further comprise a display arranged to be visible to an operator, wherein the display is configured to show the first and second pole-to-pole voltages. The operator can thus monitor the voltages in person to ensure both that the measurements are reliable, and that system is safe. The display may be mounted on the vehicle. It is also possible to provide a remote monitoring device where the vehicle sends the measurement results to an external device. The external device may be a dedicated display device, or it may be provided in the form of functionality integrated in a smartphone, a tablet or the like in the form of an app.

According to one embodiment of the invention, the system may further comprise a notification unit configured to provide a visual and/or audible indication if the voltage is not reliable. The notification unit may be a separate unit configured to sound an alarm or to flash a light if a measurement is shown to be unreliable. A notification may also be provided by a horn, a buzzer, or lights of the vehicle.

There is also provided a power system for a vehicle comprising: a high-voltage energy source; a high-voltage system; and a measurement system according to any one of the preceding embodiments, and a vehicle comprising such a power system.

According to a second aspect of the invention, there is provided a method for determining a status of a power system in a vehicle, the power system comprising: a first voltage measurement unit and a second voltage measurement unit, each of the first and second voltage measurement units being connected between a positive pole and a negative pole of the power system; and a measurement system control unit connected to the first and second voltage measurement unit. The method comprises: controlling the first and second voltage measurement unit to simultaneously measure a voltage to determine a respective first and second pole-to-pole voltage; comparing the first and second pole-to-pole voltages; and if a voltage difference is higher than a voltage threshold value, providing an indication that the voltage measurement is not reliable.

Effects and features of this second aspect of the present invention are largely analogous to those described above in connection with the first aspect of the invention.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

In the present detailed description, various embodiments of a safety circuit for a power system according to the present invention are mainly discussed with reference to a power system in a truck. It should however be noted that this by no means limits the scope of the present invention since the described invention is equally applicable in other types of vehicles such as cars, buses and construction vehicles. The described safety circuit may also be used in marine applications such as boats and ships, and in other applications comprising a high-voltage power source and a high-voltage system.

Figure 1:
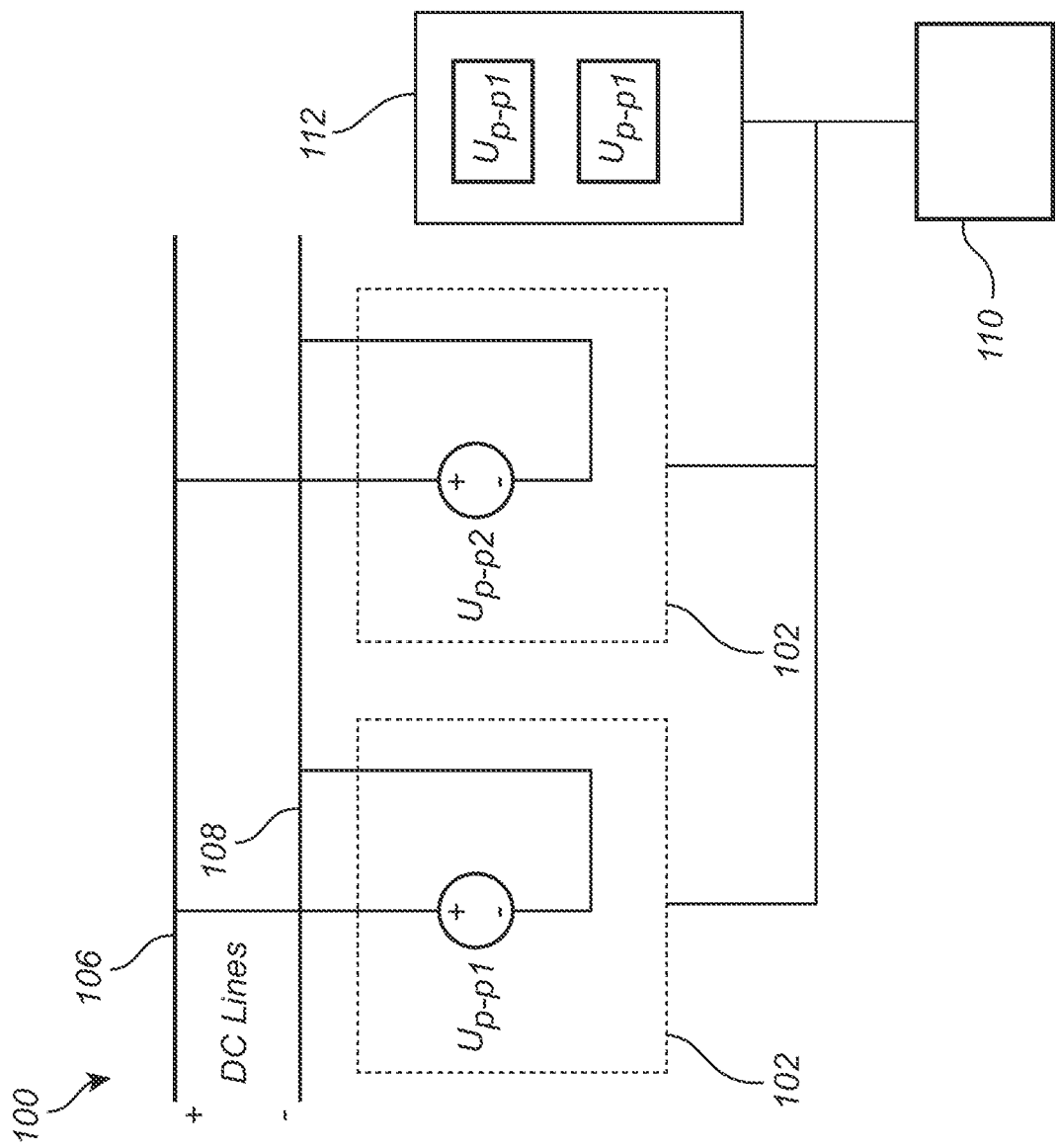
FIG. 1 is a schematic illustration of safety circuit in a power system according to an embodiment of the invention.

FIG. 1 is a circuit schematic illustrating measurement system 100 for determining a status of a high-voltage power system in a vehicle. The measurement system comprises a first voltage measurement unit 102 and a second voltage measurement unit 104, each of the first and second voltage measurement units being connected between a positive pole 106 and a negative pole 108 of the power system. The system further comprises a measurement system control unit 110 connected to the first and second voltage measurement units 102, 104.

The measurement system control unit 110 is configured to control the first and second voltage measurement units 102, 104 to simultaneously measure a voltage to determine a respective first and second pole-to-pole voltage, $U_{p\text{-}p1}$, $U_{p\text{-}p2}$, and to compare the first pole-to-pole voltage $U_{p\text{-}p1}$ with the second pole-to-pole voltage $U_{p\text{-}p2}$. The resulting voltage difference can be described as $U_{diff}=|U_{p\text{-}p1}-U_{p\text{-}p2}|$. If the voltage difference $U_{diff}$ is higher than a voltage threshold value $U_T$, an indication is provided that the voltage measurement is not reliable.

The measurement system control unit 110 may include a microprocessor, microcontroller, programmable digital signal processor or another programmable device. The control unit may also, or instead, include an application specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device. The functionality of the measurement system control unit 110 may also be integrated in one or more general purpose or dedicated ECUs (electronic control units) of the vehicle.

Figure 2:
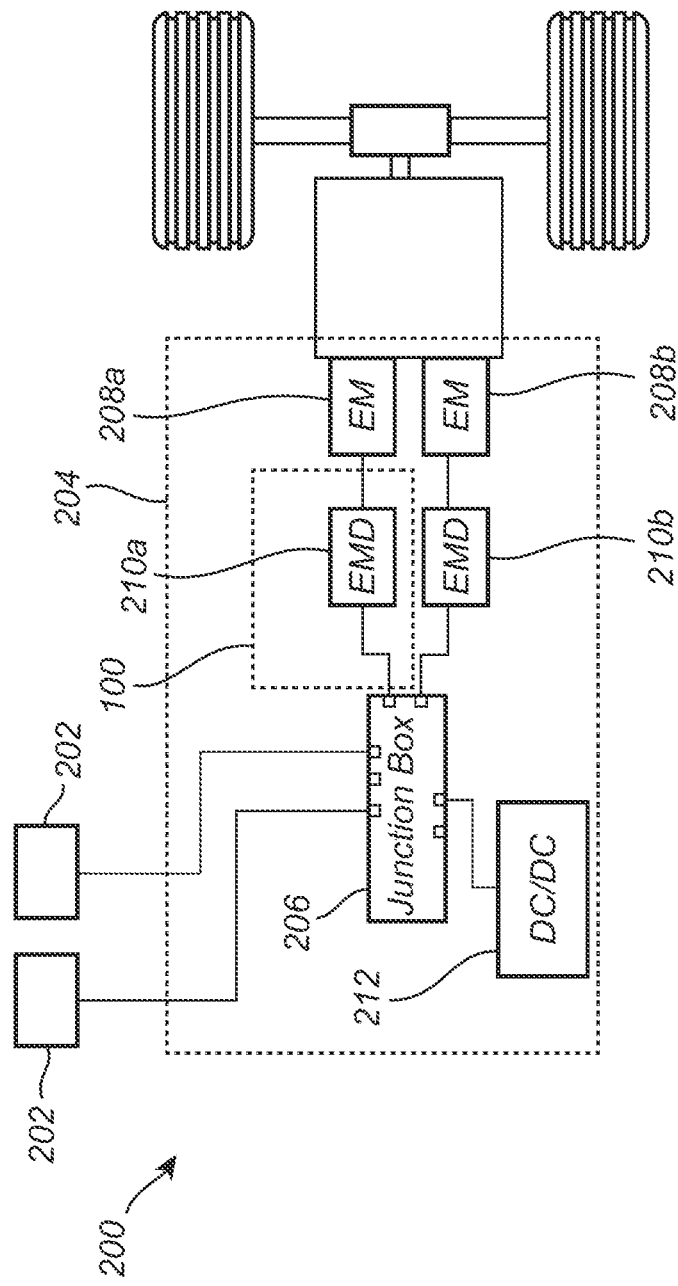
FIG. 2 is a schematic illustration of safety circuit in a power system according to an embodiment of the invention.

FIG. 2 further illustrates a display device 112 where the results of the two voltage measurements $U_{p\text{-}p1}$ and $U_{p\text{-}p2}$ are displayed. As illustrated in FIG. 1, there are no other components located between the two voltage measurement units. Accordingly, there should be no difference between the two measured voltages assuming that the measurements are performed at the same time. In an example embodiment, the voltage threshold value may be in the range of 30V to 50V, such as 40V. In practice, the threshold value and sampling rate of the voltage measurement units may be determined based on a reliability of the specific units and on the system properties as a while. A typical value would be to measure or sample the voltage every 10 ms and consider that a fault is detected if three consecutive samples indicate a fail, i.e. a voltage difference value higher than the voltage threshold value.

To further ensure the independence of the voltage measurements, the two voltage measurement units 102, 104 may be arranged in different housings, and the two may also be of different type and/or come from different manufacturers.

FIG. 2 schematically illustrates an example power system 200 comprising the measurement system 100 described above with reference to FIG. 1. The power system 200 comprises a high-voltage energy source 202 a high-voltage system 204. In the illustrated example, the high-voltage energy source 202 comprises a plurality of battery packs connected to the high-voltage system 204 via a junction box 206. The high-voltage system 204 is here illustrated as two electrical machines 208a-b for providing vehicle propulsion, each electrical machine being controlled by a corresponding electric motor drive unit 210a-b. The voltage measurement units may for example be integrated in the electric motor drive unit 210a-b, and since the two voltage measurement units are then only separated by a junction box, they are expected to give the same result. A voltage measurement unit may also be integrated in a DC-DC converter 212 of the high voltage system.

Figure 3:
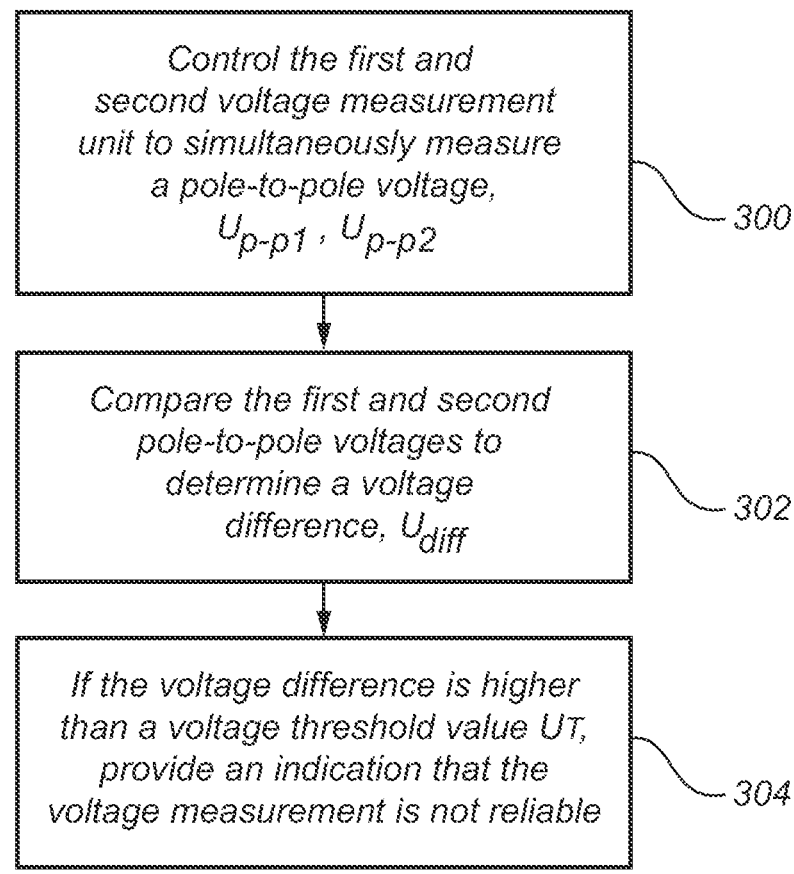
FIG. 3 is a flow chart outlining a method of controlling a safety circuit in a power system according to an embodiment of the invention.

FIG. 3 is a flow chart outlining the general steps of a method which may be performed by the above described measurement system control unit 110. The method comprises controlling 300 the first and second voltage measurement unit to simultaneously measure a voltage to determine a respective first and second pole-to-pole voltage, Up-p1, Up-p2.

Next, the first and second pole-to-pole voltage, $U_{p\text{-}p1}$, $U_{p\text{-}p2}$ are compared 302 to determine a voltage difference, $U_{diff}$. Finally, if the voltage difference $U_{diff}$ is higher than a voltage threshold value $U_T$, the method comprises providing 304 an indication that the voltage measurement is not reliable.

Figure 4:
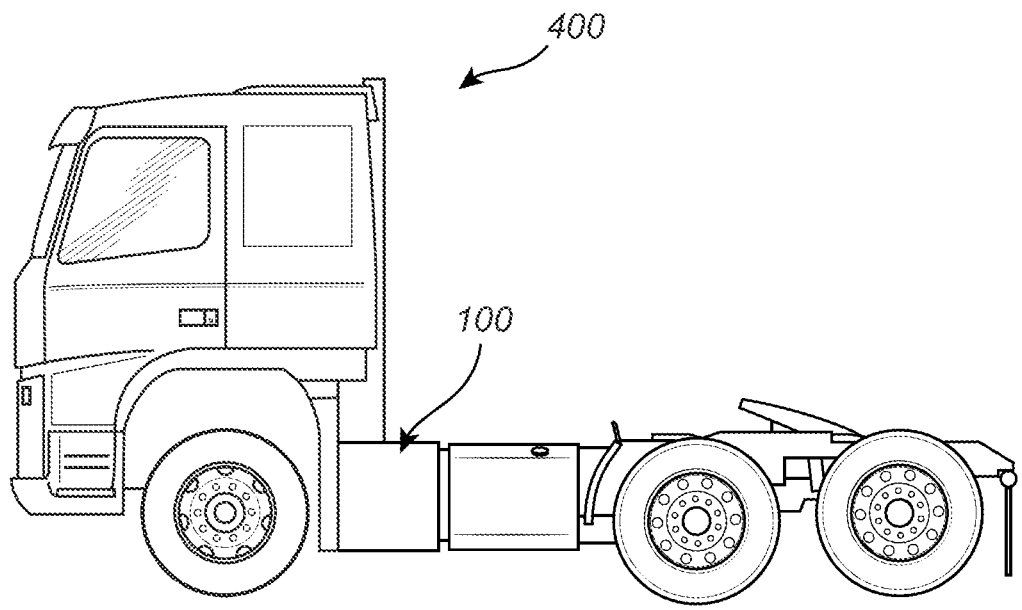
FIG. 4 is a vehicle comprising a power system according to an embodiment of the invention.

FIG. 4 is a vehicle 400 comprising a measurement system 100 for determining a status of a high-voltage power system according to any of the aforementioned embodiments and examples.

It is to be understood that the present invention is not limited to the embodiments described above and illustrated in the drawings; rather, the skilled person will recognize that many changes and modifications may be made within the scope of the appended claims.

The invention claimed is:

1. A measurement system for determining a status of a high-voltage power system in a vehicle, the measurement system comprising:

a first voltage measurement unit being connectable between a positive pole and a negative pole of the power system;

and a second voltage measurement unit, independent from the first voltage measurement unit, being connectable between the positive pole and the negative pole of the power system;

a measurement system control unit connected to the first and second voltage measurement units and configured to:

control the first measurement unit to repeatedly and simultaneously measure a voltage to determine a first pole-to-pole voltage between the positive pole and the negative pole throughout a transition period, the transition period including a time period when the high-voltage power system is being started or a time period when the high-voltage power system is being shut down;

control the second measurement unit to repeatedly and simultaneously measure a voltage to determine a second pole-to-pole voltage between the positive pole and the negative pole throughout the transition period;

compare the first pole-to-pole voltage with the second pole-to-pole voltage to determine a voltage difference, and provide an indication that the voltage measurement is not reliable when the voltage difference is higher than a voltage threshold value; and detect the start up and/or shut down of the power system, and to suppress providing an indication when the voltage difference exceeds the voltage threshold value in the the transition period when the high-voltage power system changes between start up and shut down.

2. The system measurement according to claim 1, wherein the control unit is further configured to control the first and second voltage measurement units to repeatedly measure the first and second voltages with a fixed interval, wherein the fixed interval is in the range of 10 ms to 500 ms.

3. The system measurement according to claim 1, wherein the control unit is further configured to provide an indication that the voltage measurement is not reliable when a predetermined number of consecutive voltage differences between the first and second pole-to-pole voltages are above the voltage threshold value.

4. The system measurement according to claim 1, wherein the control unit is further configured to use, as the voltage threshold value, a first voltage threshold value when the power system is in a stable state and a second voltage threshold value when the power system is in a transitional state, wherein the second voltage threshold value is higher than the first voltage threshold value.

5. The system measurement according to claim 1 further comprising a display arranged to be visible to an operator, wherein the display is configured to show the first and second pole-to-pole voltages.

6. The system measurement according to claim 1 further comprising a notification unit configured to provide a visual and/or audible indication if the voltage is not reliable.

7. A power system for a vehicle comprising:

a high-voltage energy source;

a high-voltage system;

and a measurement system according to claim 1.

8. A vehicle comprising a power system according to claim 7.

9. Method for determining a status of a high-voltage power system in a vehicle, the power system comprising: a first voltage measurement unit and a second voltage measurement unit, each of the first and second voltage measurement units being connected between a positive pole and a negative pole of the power system; and a measurement system control unit connected to the first and second voltage measurement unit; wherein the method comprises:

controlling the first measurement unit to repeatedly and simultaneously measure a voltage to determine a first pole-to-pole voltage between the positive pole and the negative pole of the power system throughout a transition period, the transition period including a time period when the high-voltage power system is being started or a time period when the high-voltage power system is being shut down;

controlling the second measurement unit to repeatedly and simultaneously measure a voltage to determine a second pole-to-pole voltage between the positive pole and the negative pole of the power system throughout the transition period;

comparing the first and second pole-to-pole voltages to determine a voltage difference; providing an indication that the voltage measurement is not reliable when the voltage difference is higher than a voltage threshold value; detecting the start up and/or shut down of the power system; and suppressing providing an indication when the voltage difference exceeds the voltage threshold value in the transition period when the high-voltage power system changes between start up and shut down.

10. The method according to claim 9, further comprising measuring the respective first and second voltages repeatedly and with a fixed interval.

11. The method according to claim 9, further comprising providing an indication that the voltage measurement is unreliable when a predetermined number of consecutive voltage differences between the first and second pole-to-pole voltages are above the voltage threshold value.

12. The method according to claim 9, further comprising:
when the power system is in a stable state, comparing the voltage difference with a first voltage threshold value as the voltage threshold value; and when the power system is in a transitional state, comparing the voltage difference with a second voltage threshold value as the voltage threshold value, wherein the second voltage threshold value is higher than the first voltage threshold value.

\* \* \* \* \*